(12) United States Patent
Kobayashi

(10) Patent No.: US 6,275,056 B1
(45) Date of Patent: Aug. 14, 2001

(54) PROBER DEVICE HAVING A SPECIFIC LINEAR EXPANSION COEFFICIENT AND PROBE PITCH AND METHOD OF PROBING THEREOF

(75) Inventor: Shigetaka Kobayashi, Hyougo-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/027,640

(22) Filed: Feb. 23, 1998

(30) Foreign Application Priority Data

Feb. 25, 1997 (JP) .................................................. 9-040546

(51) Int. Cl.⁷ .............................. G01R 1/44; G01R 31/02
(52) U.S. Cl. ............................................. 324/760; 324/754
(58) Field of Search .................................... 324/754, 760, 324/158.1

(56) References Cited

U.S. PATENT DOCUMENTS

| | | | | |
|---|---|---|---|---|
| 3,963,985 | * | 6/1976 | Geldermans | 324/754 |
| 5,555,422 | * | 9/1996 | Nakano | 324/754 |
| 5,559,446 | * | 9/1996 | Sano | 324/760 |
| 5,576,630 | * | 11/1996 | Fujita | 324/760 |
| 5,602,491 | * | 2/1997 | Vasquez et al. | 324/760 |
| 5,670,889 | * | 9/1997 | Okubo et al. | 324/760 |
| 5,848,465 | * | 12/1998 | Hino et al. | 324/757 X |

FOREIGN PATENT DOCUMENTS

| | | |
|---|---|---|
| 4-326540 | 11/1992 | (JP) . |
| 06-053294 A | 2/1994 | (JP) . |
| 07-005199 A | 1/1995 | (JP) . |
| 07-209335 A | 8/1995 | (JP) . |

* cited by examiner

Primary Examiner—Glenn W. Brown
(74) Attorney, Agent, or Firm—Daryl K. Neff

(57) ABSTRACT

A prober device is disclosed herein for making and maintaining a plurality of discrete electrical connections with an object having a plurality of conductive pads. The prober device includes an insulating substrate having a linear expansion coefficient that is less than or equal to about five times a linear expansion coefficient of the test object and a plurality of conductive probes attached thereto and having a pitch l that is substantially the same as or slightly smaller than a pitch l' of the conductive pads. When mating the prober device to the object, the prober device is heated to compensate for a difference in the pitches of the conductive pads and of the probes. Correct positioning is permitted as a result of the difference between the linear expansion coefficients of the prober device and the test object.

2 Claims, 5 Drawing Sheets

PROBER DEVICE HAVING A SPECIFIC LINEAR EXPANSION COEFFICIENT AND PROBE PITCH AND METHOD OF PROBING THEREOF

FIELD OF THE INVENTION

The present invention relates to a plate-like prober to replace the pin probers that are used for testing electrical connections in a liquid crystal display or a semiconductor device. In particularly, the present invention pertains to an elongated, plate-like prober with which multiple pins can be examined collectively. In addition, the present invention relates to a method and an apparatus for conducting a test for which such a plate-like prober is employed.

BACKGROUND OF THE INVENTION

Liquid crystal display devices, which are thin, light display devices, are employed not only as display screens for computers but are also employed for television sets and for projectors, and new applications for the devices are constantly being found. For a liquid crystal display device, a liquid crystal solution is sealed between two glass substrates, and by applying predetermined voltages to the liquid crystals for respective pixels, the relative brightness of the display can be adjusted in accordance with the alignment of the liquid crystals. A thin film transistor, shaped as a matrix, is formed on one of the glass substrates and is employed as a switching device that, in conjunction with a voltage driver that generates desired voltages and places them on a data line that is connected to the switching device, applies the predetermined voltages to the liquid crystals.

In the manufacture of the thus structured liquid crystal display devices, the most important testing procedure is the one for testing the electrical connections of a circuit. If one electrical connection failure is found in a driver for a liquid crystal display device, it is regarded as a line defect, and that display device is judged defective. The testing procedure is performed to find such defective units. Generally, in the testing procedure, an electrical circuit is actually electrified to display an image and the quality of the image is examined visually. In another type of testing procedure, the electrical connections of the circuit are examined without actually outputting an image. In either testing procedure, it is necessary to conduct electricity to a circuit formed on a glass substrate (hereinafter referred to as a test object) that is to be inspected.

A tool used for electrification in the test process is a prober. According to a common method used for conducting electricity, a prober is brought into contact with a conductive contact point (hereinafter referred to as a pad) on a test object, and electricity is conducted thereto. The probing technique was originally developed for testing semiconductor devices, and the original prober is a so-called pin prober, for which an extremely fine line is employed as a conductive member, its distal end being used to contact a test pad. The pin prober method of continuity testing has various shortcomings.

As the first of the shortcomings, because of the increased density of integrated circuits manufactured now, the spacing between pins on such probers is extremely small to accommodate the extremely small spacing between pads of the test object. In addition, the diameter of pins on such probers has been drastically reduced. Currently, the pitch between the pads are 70 $\mu$m or less. Since a prober having a tiny diameter that corresponds to such a pitch is easily deformed, its service life is short. If the prober is not deformed, adjacent pins may contact each other, which increases the chance that testing will not be performed as expected. In addition, because of the fine structure, it is very difficult to accurately bring the pin prober into contact with a test pad. While constant pressure must be applied to bring the prober into contact with the contact point, the applied pressure must be extremely light because of the tiny diameter of the prober. However, when too light a pressure is applied, it is more difficult for the prober to penetrate an oxide film on the surface of a contact point so that electrical contact can be made between the distal end of the prober and the pad surface.

A probe block may be used to accurately bring the prober into contact with a test pad in accordance with the position pattern of the test pad. Because of the fine circuit pattern, a high degree of accuracy and material durability are required to manufacture probe blocks. This prolongs the time required to manufacture probe blocks and increases manufacturing costs.

When there is a shift in the positioning of a fine prober, electrical contact cannot be made, and some damage may occur. The lengthening of the time period for manufacturing such test tools, and increase in the manufacturing costs is not compatible with the current trend towards manufacturing a greater variety of product types in smaller quantities than was once the norm.

To cope with the above—noted problems, lately, improved probers have been proposed for replacing the conventional pin probers. As examples there is proposed a prober where the distal end of a lead is specially processed to resemble a pin, a prober where a bump is formed at the distal end of a lead to improve contact, and a prober where the material of the pin prober is improved to provide elasticity. However, the inspiration for these improved probers is basically the same as that which produced the conventional pin prober, and such probers do not adequately address the above shortcomings.

Instead of a pin prober, a flat prober (a plate-like prober) has been proposed as a test tool. For example, Japanese Unexamined Patent Publication No. Hei 7-240443 describes a prober structure wherein test circuitry and a bump that contacts a test object are formed on an insulating substrate in the named order, and the circumference of the bump is covered with an insulating layer. For electrical connection with a pad, the plate-like prober is so designed that a bump that contacts a pad is formed on an organic sheet in accordance with the position pattern of the pad.

However, these existing probers and methods do not describe a method for improving the durability of a conventional plate-like prober, and a method for maintaining satisfactory electrical contact in association with a change in temperature. Further, a plate-like prober currently known has the same problems as does the conventional pin prober relative to accuracy and manufacturing costs. In addition, for a currently known plate-like prober of a type that contacts each TAB of a test object, positioning is required for each TAB and testing costs are increased.

Recently, a technique called COG (Chip On Gate) has become popular. Conventionally, a driver chip of a liquid crystal display device is mounted on a TAB, which is then mounted in a liquid crystal display panel. By the COG technique, however, the driver chip is mounted directly on a liquid crystal panel. Consequently, the width of a test object is narrowed considerably. This makes the pin prober unusable for liquid panel that is fabricated according to the COG technique.

OBJECTS OF THE INVENTION

Accordingly, it is a first object of the present invention to provide a plate-like prober having dimensions that correspond to a very small pitch of 70 μm, and which adequately and reliably contacts the pads of the test object.

It is a second object of the present invention to provide a plate-like prober that can be manufactured at low cost and which reliably makes and maintains adequate connections with a test object.

It is a third object of the present invention, accompanying the first object, to provide a method whereby an efficient and reliable testing procedure can be performed by employing such a plate-like prober, and a device therefor.

It is a fourth object of the present invention to provide a plate-like prober that is adapted to mate with a test object having a reduced width.

It is a fifth object of the present invention to provide a plate-like prober with which an entire side of a test object can be tested at one time, for which positioning is not required for each of a plurality of TABs arranged along one side of a test object, and for which the positioning need be performed only one time for the entire side of the test object.

SUMMARY OF THE INVENTION

A plate-like prober according to the present invention comprises: an insulating substrate having a linear expansion coefficient that is less than or equal to about five times a linear expansion coefficient of the test object and a plurality of conductive probes attached to the insulating substrate and having a pitch substantially the same as or slightly smaller than a pitch of the conductive pads.

DESCRIPTION OF THE PREFERRED EMBODIMENTS

Figure 1:
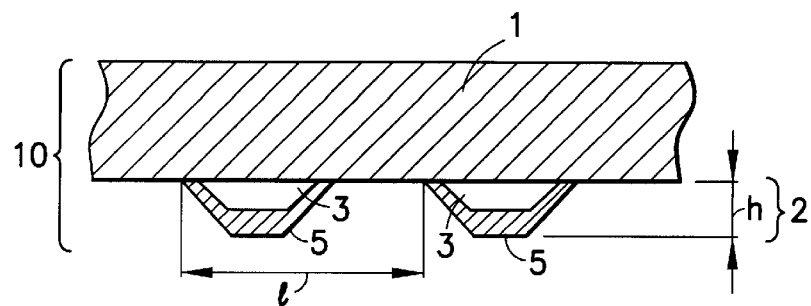
FIG. 1 is a cross-sectional view of a plate-like prober according to the present invention.

FIG. 1 is a cross-sectional view of a plate-like prober according to the present invention. A plate-like prober 10 comprises an insulating substrate 1 and conductive probe portions 2 that are formed on the insulating substrate 1. The insulating substrate 1 is formed of a glass epoxy substrate. The glass epoxy substrate has a linear expansion coefficient of 8 to 20 ppm/° C., which is five times the linear expansion coefficient of the test object. It is preferable that the insulating substrate 1 be flexible. The thickness of the insulating substrate is, therefore, 50 to 300 μm.

The probe portions 2 are formed at a pitch of 1 in FIG. 1. The probe portions 2 are generally linear conductive circuits that are extended perpendicular to the surface of a paper sheet. The pitch 1 in this invention is 100 μm or less, preferably 75 μm or less.

The probe portions 2 must be conductive, and preferably are formed of metals, such as gold, platinum, copper, nickel and aluminum that have a satisfactory conductivity and corrosion resistance, or an alloy of such metals. In FIG. 1, the conductive probe portions 2 are laminates comprising a plurality of layers made of certain of the above metals. For example, copper is used for a first layer 3, and a nickel aluminum alloy is used for a second layer 5. Within the multiple-layered structure of the probe portions 2, the materials of the first layer 3 of the probe can be selected primarily for their conductivity properties while the materials of the second layer 5 are prefereably selected to have good wear resistance and corrosion resistance properties. While there is no particular limitation as to the height h of the probe portions 2, a height of 20 μm or less is generally preferred for the manufacturing process.

Figure 2:
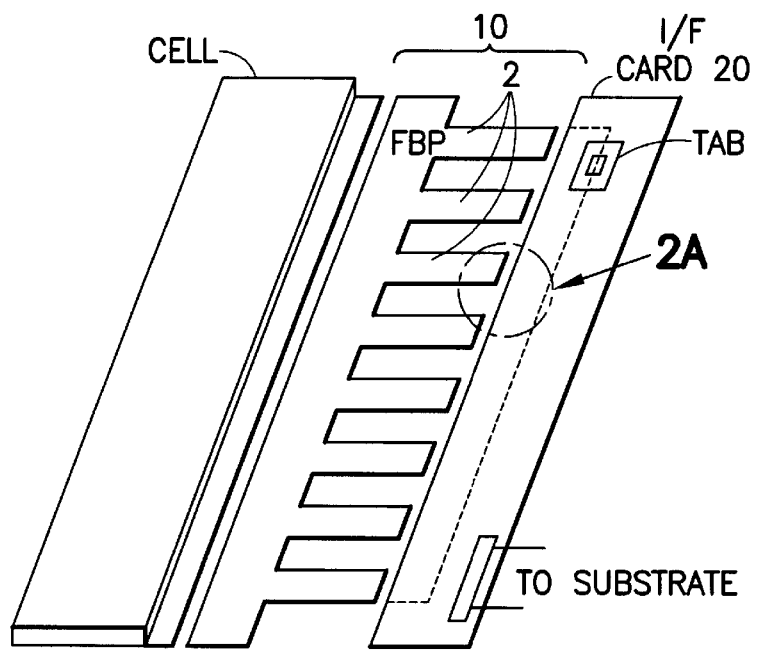
FIG. 2 is a diagram showing the positional relationship, at the time of testing, between the plate-like prober and a test object according to the present invention.
Figure 2A:
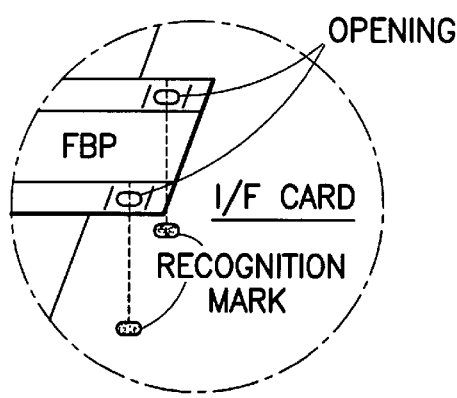

FIG. 2 shows a test arrangement in which a test object 20 is examined using the plate-like prober 10 of the present invention. As is shown in FIG. 2, the plate-like prober 10 is formed in the shape of a comb, each tooth of the comb contacting a TAB on the test object 20 under pressure. A probe portion (not shown), which contacts a pad on the test object 20, is formed on the reverse side of each tooth of the comb. Generally, a plate-like prober 10 will contain from 100 to 500 probe portions 2, which extend from the insulating substrate 1 as the teeth of a comb.

The plate-like prober 10 of the present invention can be manufactured using the same method as is used for a printed circuit board. More specifically, a photoresist is formed on the insulating substrate 1 using a mask that has the same pattern as a pad on the test object 20, and is exposed and developed. Then, to form the conductive probe portions, a metal portion is formed on the insulating substrate 1 by either a wet or dry process, such as electroless plating, electrolytic plating, vacuum evaporation or CVD. The sides of the insulating substrate 1 on which the probe portions 2 are formed are finally pressed by a die, or are removed by a cutter.

The pitch of the plate-like prober 10 of the present invention must be particularly accurate. The insulating substrate is an organic resin substrate mixed with glass fiber, and is easily affected by temperature and humidity. It is, therefore, preferable that the above process be performed in an environment where a constant temperature and humidity level are maintained.

The insulating substrate 1 used for the plate-like prober 10 of the present invention includes a glass epoxy substrate. The glass epoxy substrate has a linear expansion coefficient that is relatively close to the liner expansion coefficient (4 ppm/° C.) of glass, which is a material to be tested in the testing procedure for a liquid crystal display device. The linear expansion coefficient of only the glass epoxy substrate of this invention is about 8 to 20 ppm/° C.

After the probe portions 2 are formed on the insulating substrate 1 the linear expansion coefficient is generally reduced. The linear expansion coefficient of the plate-like prober 10 (the insulating substrate 1 on which the probe portions 2 are formed) is about 4 to 8 ppm/° C. Since the linear expansion coefficient is controlled in such a range, the size can be easily compensated for in the testing procedure, as will be described later.

It will be understood that if the material from which the insulating substrate is formed has a linear expansion coefficient which is too different from that of the test object, it will not perform satisfactorily. For example, while polyimide can be easily processed in detail and metal probe portions can be formed at small pitches, polyimide has a linear expansion coefficient of 40 ppm/° C., and is not an appropriate substance for the insulating substrate of the present invention. If an insulating substrate having such a great linear expansion coefficient were incorporated into a plate-like prober, the pitch between the probe portions 2 would be greatly changed, even for only a slight difference in temperature, and the control of the temperature during measurement and positioning would be extremely difficult.

Taking this into consideration, an appropriate linear expansion coefficient for an insulating substrate for the present invention should be not more than five times the linear expansion coefficient of the test object 20, and preferably, not more than three times. When an insulating substrate having a linear expansion coefficient in the above range is employed, a plate-like prober 10 can be provided having a linear expansion coefficient three times that of the test object 20.

In addition, materials that expand by absorption of moisture to vary in dimensions depending on whether wet or dry are not suitable for the insulating substrate of the present invention. If such materials are used, the size of the completed plate-like prober will differ greatly depending on the humidity level during the manufacturing process for the plate-like prober. However, even if a material that has a superior humidity absorption property is employed, size changes due to humidity will still occur. For this reason, the manufacturing process must be performed under conditions of controlled humidity.

Further, in order to provide satisfactory electrical connection, the plate-like prober of the present invention must preferably dent the test object when it contacts it under pressure. Therefore, the insulating substrate of the platelike prober 10 should be flexible.

As a conclusion of the above described conditions, the material for the insulating substrate 1, which constitutes the plate-like prober 10 of this invention, must have the following required properties:

(1) a linear expansion coefficient that is different from but still less than or equal to about five times that of a test object;

(2) little changes in shape or dimensions due to humidity;

(3) little deformation due to pressure and great plasticity;

(4) suitable for use in the manufacturing process under stable conditions; and (5) flexibility.

Figure 4:
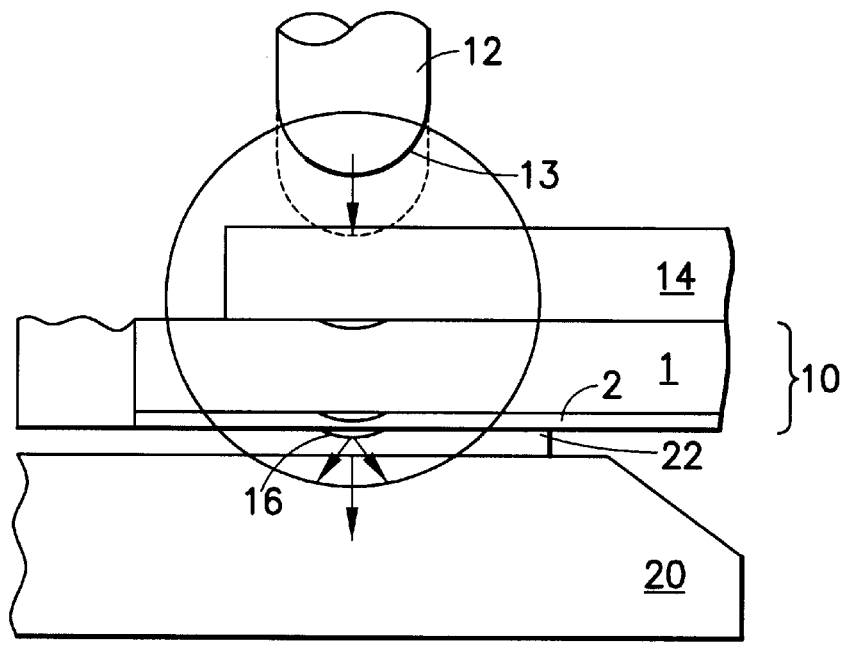
FIG. 4 is a diagram showing a mechanism for obtaining an electrical connection between the plate-like prober and the test object.

The present invention also includes a testing step for the plate-like prober 10. Referring to FIG. 4, the testing step can be divided into a step of positioning the plate-like prober 10 and the pitch of a pad 22 on the test object 20, and a pressing step of pressing the probe portions 2 of the plate-like prober 10 against the pad 22 on the test object 20.

Figure 3:
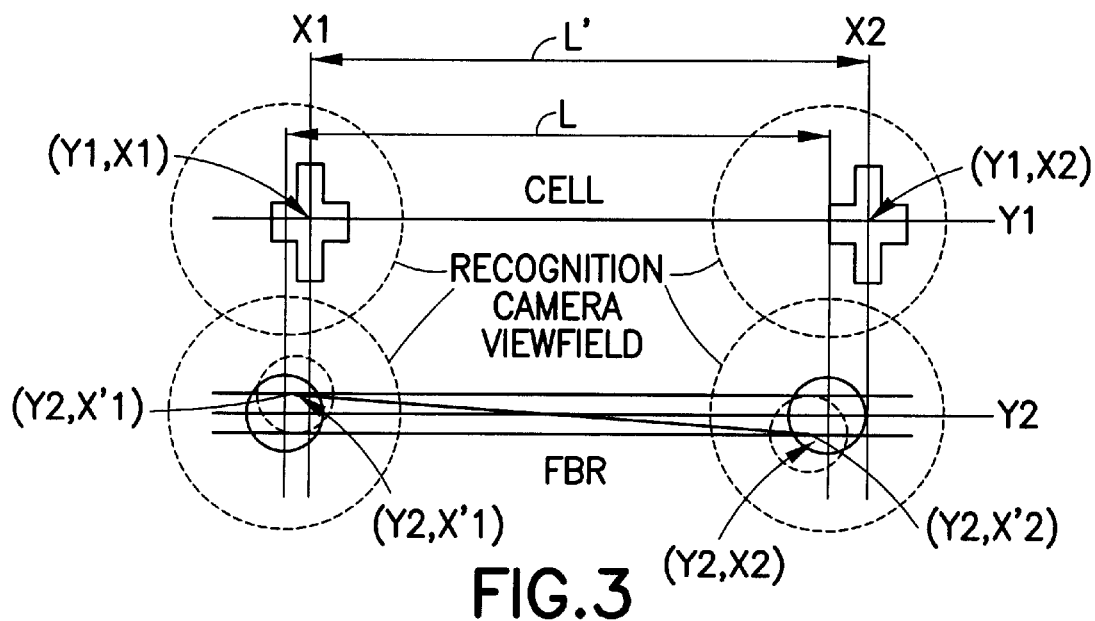
FIG. 3 is a diagram for explaining the positioning step in a testing method according to the present invention.

With reference to FIG. 3, the step of positioning the plate-like prober 10 and the pitch of the pad 22 on the test object 20 includes a first step of aligning x and y coordinates of the prober 10 and the pad 22, and a second step of compensating for a difference in the pitches of the two. The first step is well known to one having ordinary skill in the art.

The second step is performed by heating the entire plate-like prober 10. Generally, since the linear expansion coefficient of the plate-like prober 10 is greater than that of the test object, the pitch l of the probe portions 2 of the plate-like like prober 10 is set slightly smaller than pitch l' of the pad 22 on the test object 20. As one example, the pitch difference $\Delta l = l' - l$ is corrected by heating only the plate-like prober 10. If heating can be performed to any desired temperature, complete positioning can be performed even though the difference in pitch varies depending on the lot of the objects tested.

The essential feature of the present invention is that the difference in pitches between the plate-like prober 10 and the pad 22 of the test object 20 is corrected by a difference in their linear expansion coefficients. In another example, only the test object 20 is heated to correct for the difference in the pitch of the test object 20 and of the prober 10. Alternatively, both the plate-like probe 10 and the test object can be heated at different rates. However, heating the test object may cause deterioration of test quality, or the test object may be too large to be uniformly heated. Consequently, it is preferred to heat only the plate-like prober 10 and not the test object.

It will be understood that changes in the plate-like probe 10 due to environmental temperature and humidity conditions, pressure deformation, or errors due to manufacturing inaccuracy accumulate to provide a pitch difference $\Delta X$ to be corrected. However, when a plate-like prober is employed that is formed on an insulating substrate having a linear expansion coefficient greater than that of a test object, these cumulative errors can be corrected by heating the plate-like prober and the test object when the measurements are made.

The positioning step will be described in detail while referring to FIG. 3. The recognition axes are (Y1, Y2) and (X1, X2), as is shown in FIG. 3. Although the barycenter at the recognition mark of a test object can actually have an offset as well as a recognition mark on the plate-like prober, for simplicity, the (X, Y) axes are set the same as the recognition axes in FIG. 3. Broken line circles are recognition mark positions for the plate-like prober before θ compensation. In the following explanation, the pitch of the probe portion of the plate-like prober and the pitch of the pad on the test object are denoted as l and l'.

In the positioning process, at the first step, X and Y coordinates for the recognition marks (indicated by crosses) of the test object are aligned with those for the recognition marks (indicated with circles) of the plate-like prober. The center positions for the recognition marks of the test object are used for aligning the center positions for the recognition marks of the plate-like prober. Then, the temperature is calculated for heating the plate-like prober to compensate for pitch difference $\Delta l = l' - l$.

Data required for position compensation for the plate-like prober are a shifting volume toward X axis, $\{(X2-X'2)-(X1-X'1)\}$, and the pitch of the probe portion, $l=(X'2-X'1)$. The correction for the center shifting volume of the plate-like prober is calculated as $\{(X2-X'2)-(X1-X'1)\}/2$.

When $l \neq l'$, the difference in the pitches is compensated by heating the plate-like prober. When $\Delta l = l' - l$ is sufficiently smaller than the pitches, this is not a problem in particular. When $\Delta l = l' - l$ is not smaller, not only is connection difficult, but the risk of an unintended connection or a short-circuit with an adjacent electrode increases. Therefore, in this case, compensation for pitch difference must be performed according to the probing method of the present invention.

The difference in pitches to be compensated should be detected, in advance, not only by using recognition data values for determination, but also by applying the following electrical detection procedure. The plate-like prober is mounted on a plate-like heater. Assuming that the expansion volume for the plate-like prober at temperature T of the heater is ΔX, ΔX=Δl=l'−l . . . compensation value required for the plate-like prober, so that compensation can be performed.

The temperature compensation value T to which the plate-like probe should be heated is determined by T≈k·ΔX/(Δτ·s)

where Δτ is thermal distortion (/° C.) in direction X because of the temperature property of substrate material;

s is the length (m) of plate-like prober in direction X; and k is the ratio of calculated value at compensation temperature to actual expansion.

It will be understood that the value k has to be set for individual lots of plate-like probers because of a shrinking element due to heat discharge and an expansion element due to pressure when the test object contacts an electrode. This k value is registered as type/lot data. The value k is normally 0.8 to 1.5.

The upper limit Tmax of the temperature compensation value T is restricted by the capability of the heater and by the material of the insulating substrate. The heat resistance of the insulating substrate is generally about 130° C. Although the insulating substrate can be heated to around this temperature, a preferable temperature for heating is 100° C. or lower. Otherwise, if only the plate-like prober is heated and if, as a result, the difference in the temperature at the plate-like prober from that of the test object is too great, a drastic fall in temperature will occur immediately after the plate-like prober contacts the test object, which makes positioning difficult. Therefore, the temperature compensation value for heating plate-like prober 10 to compensate for a difference in pitch AX should be restricted to within Tmax, while referring to the above equation.

The pressing mechanism will now be described while referring to FIG. 4. FIG. 4 is a cross-sectional view of the plate-like prober and the probe portion in the longitudinal direction. In a pressing step in which the probe portion 2 of the plate-like prober 10 is pressed against the pad 22 of the test object 20, a tool for pressing against the plate-like prober 10 is employed. When the pressing step is insufficient, the electrical connection between the pad 22 on the test object 20 and the probe portion 2 of the plate-like prober 10 will not be satisfactory. Especially when the pad 22 of the test object 20 is made of aluminum, electrical connection tends to be interrupted by an oxide film or a passivation film deposited on the surface of the pad 22. Microscopically, the surface of such metal has fine raised and recessed sub-micron portions, and the regularity of the arrangement and shapes of these portions, on the face where the probe portion 2 of the plate-like prober 10 and the pad 22 of the test object 20 contact each other, has an extremely high entropy. On the other hand, the oxide film, on the surface of the pad 22 of the test object 20, that is a barrier for electrical connection is several hundreds of angstroms. When a predetermined pressure is applied to the plate-like prober 10 and shear stress is applied to cause denting (deformation) of the contact face, satisfactory electrical connection is provided.

The test object 20 is a glass panel, and the conductive pad 22 is formed thereon. The pad 22 is actually an aluminum electrode. The plate-like prober 10 of the present invention is constituted by the insulating layer 1 and the probe portion 2, and the probe portion 2 is positioned opposite the pad 22. Pressure is applied to an interface 16 between the probe portion 2 and the pad 22 by a pressing tool 12 having a rounded end, which for pressing is located immediately above. By the employment of the pressing tool 12, the insulating substrate 1 of the plate-like prober 10 is dented, and the denting is transferred to the probe portion 2. As a result, shear stress is produced at the interface 16, and the probe portion 2 acts as if it were being rubbed against the surface of the pad 22. Through this shear action, the probe portion 2 breaks the oxide film on the pad 22 to implement a satisfactory electrical connection.

In addition, a pressure buffer 14 can be located between the pressing tool 12 and the insulating substrate 1 of the plate-like prober 10. The pressure buffer 14 will provide uniform contacts by absorbing the roughness on the surfaces of the plate-like prober 10 and the pad 22 on the test object 22.

Figure 5:
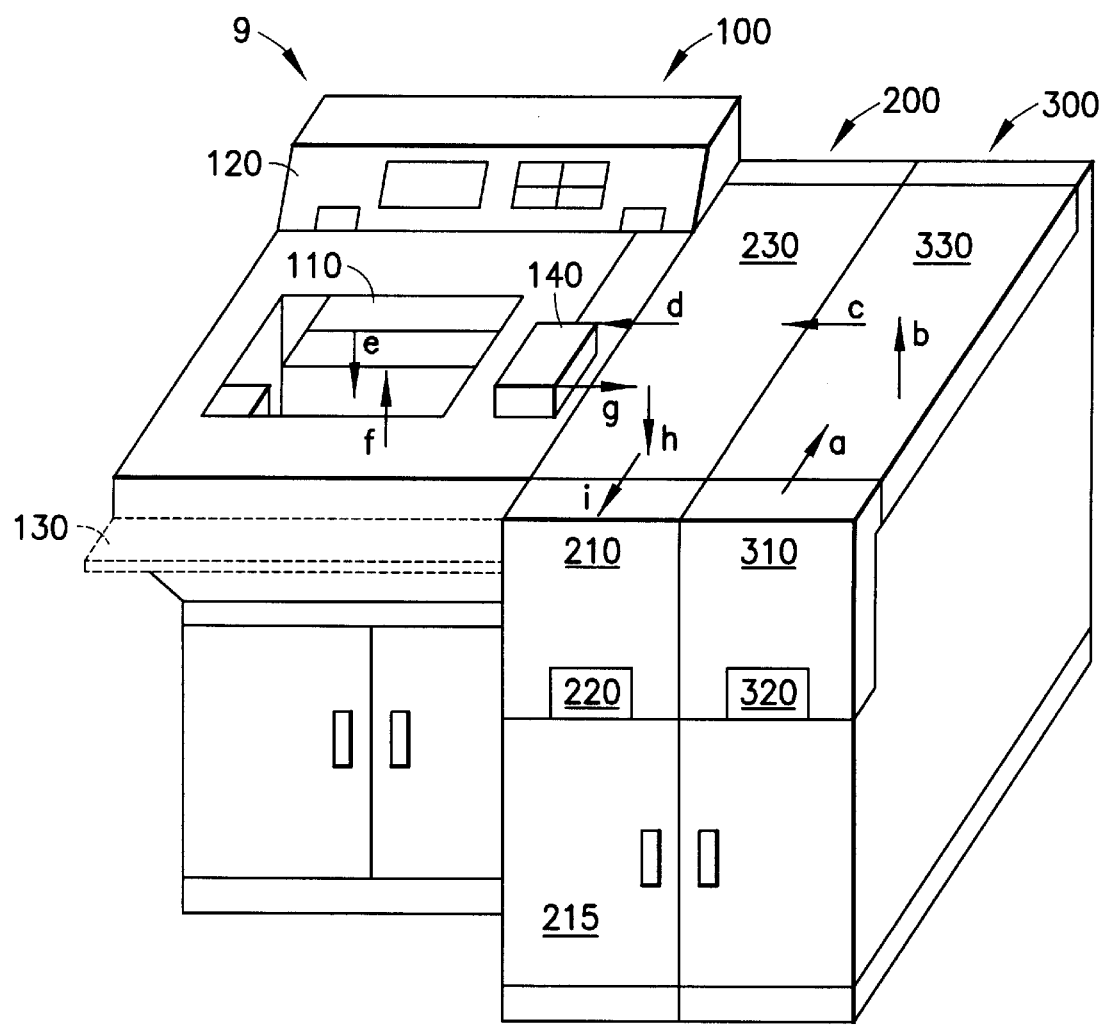
FIG. 5 is a conceptual diagram illustrating a testing machine according to the present invention.

FIG. 5 is a conceptual diagram illustrating an apparatus for testing involving the use of a plate-like prober according to the present invention. A testing machine 9 comprises a testing unit 100 that includes a test stage and a controller; a loading unit 300 for loading a test object; and an unloading unit 200 for temporarily storing a test object after testing has been completed. The testing unit 100 actually includes a testing stage 110 on which a test object is placed to conduct the testing of the plate-like prober 10; a display section 120 for an operator; and an instruction section 130 with which an operator can enter instructions. In FIG. 5, a key pad 140 is also included for entering additional instructions.

The flow of the test object will now be described with arrows a to i. First, the test object is placed in a loading section 310 in the loading unit 300. A window 320 may be provided for the loading section 310, as needed. Then, as is indicated by arrows a, b, c and d, the test object is passed through a conveyer 330 of the loading unit 300 and a conveyer 230 of the unloading unit 200 and is transferred to the testing unit 100. Then, the test object is placed on the testing stage 110 as is indicated by arrow e.

The testing procedure is performed for the test object on the testing stage 110, by using the plate-like prober 10 at the positioning step and at the pressing step, as will be described later. The test can be conducted by an operator by entering predetermined input at the instruction section 130, or can be automatically performed. The results of the testing are displayed on the display section 120.

When the testing is completed, the test object is removed from the testing stage 110, as is indicated by arrow f, and is passed through the conveyer 230 of unloading unit 200 and temporarily stored in an unloading stocker 210. An unloading stocker 215 for defective products may be provided for the unloading stocker 210 for the separation of defective test objects. A window 220 can be provided for the unloading stocker 210.

Figure 6:
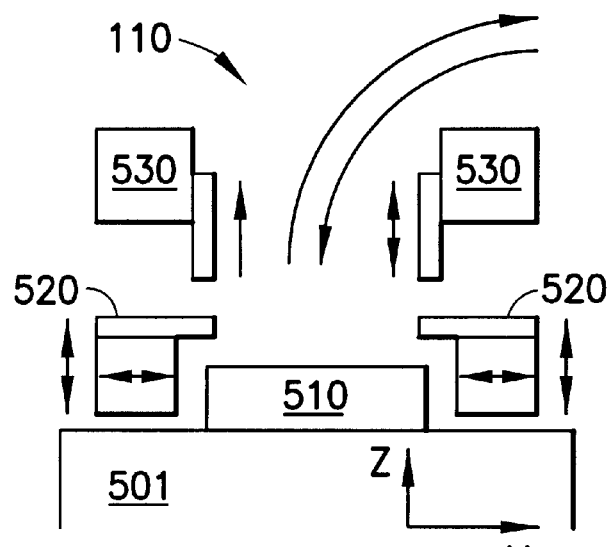
FIG. 6 is a conceptual diagram illustrating a testing stage according to the present invention.

FIG. 6 is a conceptual diagram illustrating the testing stage 110, which is the essential portion in this embodiment. The testing stage 110 includes a cell stage 510 located on a base 501; a prober stage 520 located above the base 501 and adjacent to the cell stage 510; and a pressing stage 530 on which is mounted a jib for pressing the pad on the test object and the probe portion of the plate-like prober. As is shown in FIG. 6, the prober stage 520 and the pressing stage 530 are symmetrically provided on either side of the cell stage 510. The test object is placed on the cell stage 510 along the route described by the arrows, and is removed after the testing is over. When the test object (not shown) is placed on the cell stage 510, the probe stage 520 is moved in direction y (to the right and to the left relative to the surface of the paper) and direction z (upward and downward across the surface of the paper), to begin the positioning step. The cell stage 510 does not shift in direction z, and moves only in direction x (perpendicular to the surface of the paper) and direction y. When the positioning step is completed, the pressing stage 530 moves in direction z, and the pressing step for pressing the pad on the test object and the probe portion of the plate-like prober is begun. The testing is conducted in a sequence following that for the steps.

Figure 7:
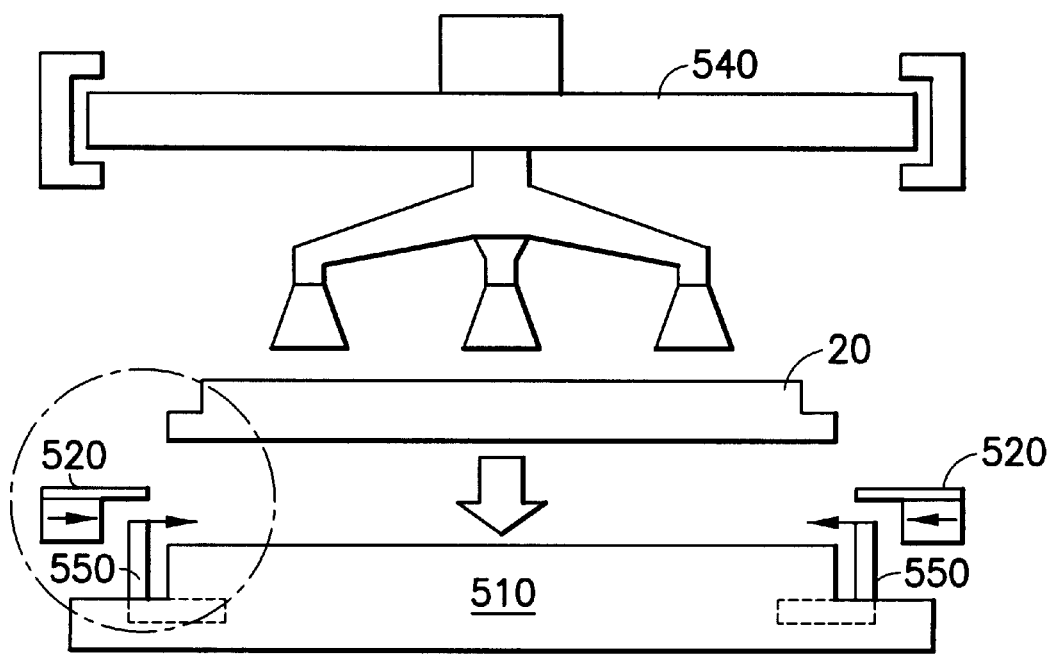
FIG. 7 is a diagram showing a mechanism for feeding a test object according to the present invention.

FIG. 7 is a specific diagram of the condition where the test object 20 is to be mounted on the cell stage 510 by a moving arm 540. The moving arm 540 moves the test object 20 from the loading section 310 onto the cell stage 510. Although, in FIG. 7, the moving arm 540 uses suction to move the test object 20, the present invention is not limited to this. In FIG. 7, aligners 550 are provided on both sides of the cell stage 510 to assist in the accurate positioning of the test object 20 on the cell stage 510. The aligners 550 move in direction y and hold, from both sides, the test object 20 that was tentatively placed on the cell stage 510. As a result, the test object 20 can be located at a satisfactory position in direction y.

Figure 8:
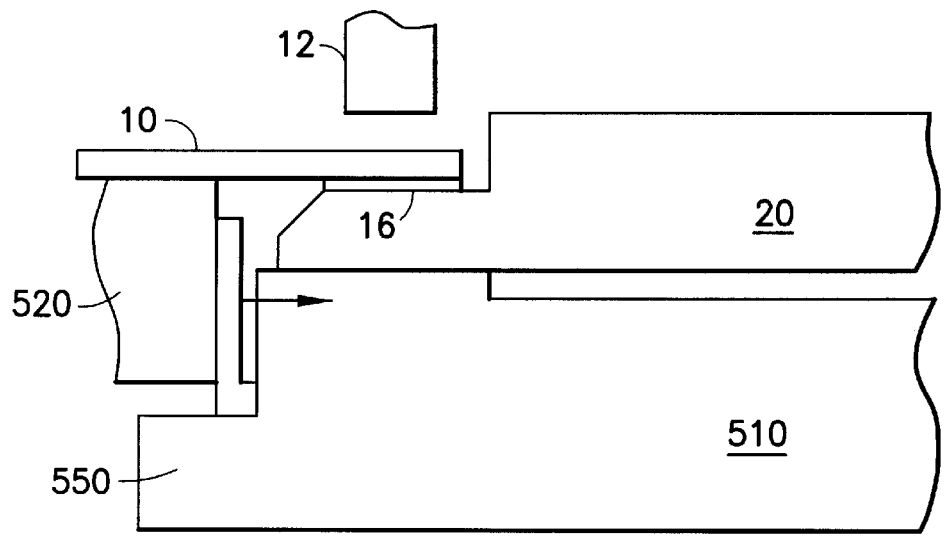
FIG. 8 is an enlarged diagram showing electrical connection portions of the plate-like prober and the test object during the testing according to the present invention.

In FIG. 8 is shown the positional relationship (enlarged portions in circles in FIG. 7) of the cell stage 510 and the prober stage 520 after the positioning step is completed and before the pressing step is begun. Also referring to FIG. 7, when the test object 20 is located at a satisfactory position on the cell stage 510, the prober stage 520 moves in direction y, and the positioning step is begun. The plate-like prober 10 is fixed to the prober stage 520, and the probe portion (not shown in FIG. 8) of the plate-like prober 10 is positioned with the pad 22 (not shown in FIG. 8) on the test object 20. When the positioning is completed, the pressing step is begun. At the pressing step, the pressing tool 12 provided for the pressing stage (not shown in FIG. 8) moves in direction z, and applies pressure to the plate-like prober 10. Due to this pressure, compression force and shear stress are generated on the interface 16, and probe portion 2 of the plate-like prober 10 and the pad 22 on the test object 20 are electrically connected.

Figures 9A, 9B:
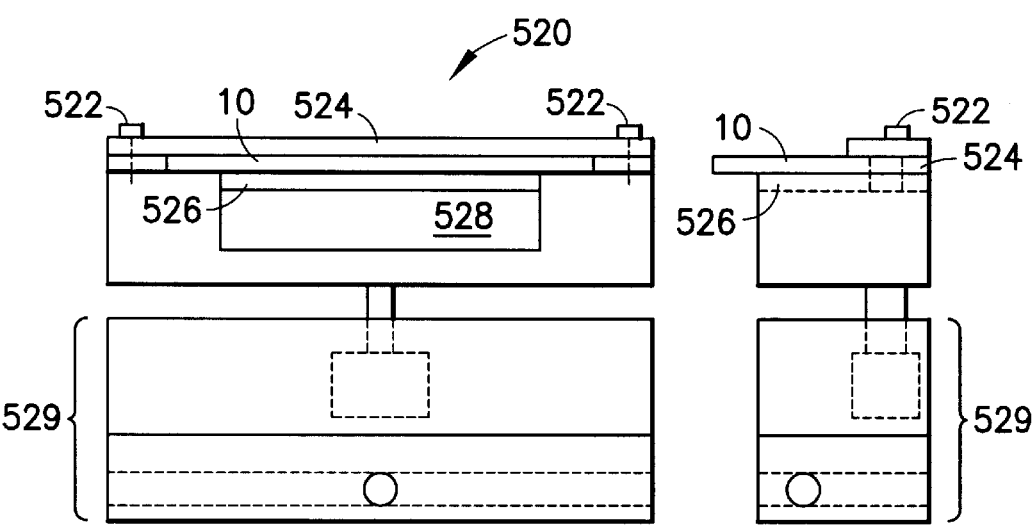
FIGS. 9(a) and 9(b) are specific diagrams illustrating a prober stage for the apparatus of the present invention.

At the positioning step, heat is applied to all of the plate-like prober 10, so that the difference between pitch l of the probe portion 2 of the plate-like prober 10 and pitch l' of the pad 22 on the test object 20 is compensated by using the difference between their linear expansion coefficients. For this, a heating unit is provided for the prober stage 520. FIG. 9 is a schematic diagram showing the prober stage 520. FIG. 9(a) is a diagram showing the prober stage 520 as viewed from the cell stage 510 side, and FIG. 9(b) is a cross-sectional view perpendicular to that in FIG. 9(a). As is apparent from these drawings, the plate-like prober 10 is fixed by screws 522 over spacers 524. A plate-like heater 528 is arranged below the plate-like prober 10, and heat is uniformly transmitted via an adequate plate 526. These mechanisms are supported by an x, y, z stage 529.

According to the present invention, provided is a platelike prober that can cope with a tiny pitch of 70 µm or smaller, and that ensures an adequate connection with a test object.

Further, according to the present invention, provided is a method whereby an efficient and reliable testing procedure can be performed by employing such a plate-like prober, and a device therefor.

In addition, according to the present invention, a plate-like prober is provided, with which an object can be tested, by heating the prober in order that a difference between the pitch of the probe portion of the plate-like prober and the pitch of the pads on the test object can be compensated, and so that a stable and delicate compensation process can be performed.

While the invention has been described in relation to certain preferred embodiments thereof, those skilled in the art will recognize many modifications and enhancements which can be made without departing from the true scope and spirit of the present invention.

What is claimed is:

1. A method of making and maintaining a plurality of electrical connections to an object having a plurality of conductive pads, comprising the steps of:

fixing said object to a base;

placing a prober device in close proximity to said object, said prober device having an insulating substrate having a linear expansion coefficient that is greater than and up to about five times a linear expansion coefficient of said object, and a plurality of conductive probes attached to said insulating substrate and said conductive probes having a pitch substantially the same as, or slightly smaller than a pitch of said conductive pads;

detecting a difference between said pitch of said conductive probes and said pitch of said conductive pads;

determining a temperature T to which said prober device is to be heated in order to reduce said pitch difference, thereby permitting electrical connections to be made between a desired plurality of said probes and said pads corresponding thereto;

heating said prober device to said temperature T to compensate for said pitch difference between said conductive probes and said conductive pads; and applying pressure to interfaces between said conductive probes and said conductive pads to effect electrical connections.

2. The method of claim 1 wherein said step of applying pressure applies shear stress to said interfaces.

* * * * *